United States Patent
Konishi et al.

(10) Patent No.: US 10,128,665 B2
(45) Date of Patent: Nov. 13, 2018

(54) POWER SUPPLY APPARATUS

(71) Applicant: Murata Manufacturing Co., Ltd., Nagaokakyo-shi, Kyoto-fu (JP)

(72) Inventors: Masanori Konishi, Nagaokakyo (JP); Hajime Shiji, Nagaokakyo (JP); Shouhei Hirose, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 344 days.

(21) Appl. No.: 15/235,292

(22) Filed: Aug. 12, 2016

(65) Prior Publication Data

US 2016/0352123 A1 Dec. 1, 2016

Related U.S. Application Data

(63) Continuation of application No. PCT/JP2015/054532, filed on Feb. 19, 2015.

(30) Foreign Application Priority Data

Feb. 21, 2014 (JP) .................. 2014-031992

(51) Int. Cl.
*H02J 7/00* (2006.01)
*H02M 1/32* (2007.01)
(Continued)

(52) U.S. Cl.
CPC ............... *H02J 7/00* (2013.01); *G11C 5/148* (2013.01); *H02M 1/32* (2013.01); *H02M 1/36* (2013.01);
(Continued)

(58) Field of Classification Search
USPC ........................................................ 320/163
See application file for complete search history.

(56) References Cited

U.S. PATENT DOCUMENTS

2007/0063736 A1 3/2007 Biagi
2009/0033302 A1 2/2009 Hariu
(Continued)

FOREIGN PATENT DOCUMENTS

JP 10-42550 A 2/1998
JP 10-112942 A 4/1998
(Continued)

OTHER PUBLICATIONS

English translation of Official Communication issued in corresponding International Application PCT/JP2015/054532, dated May 19, 2015.
(Continued)

*Primary Examiner* — Robert Grant
(74) *Attorney, Agent, or Firm* — Keating & Bennett, LLP

(57) ABSTRACT

A power supply apparatus includes a converter, an output voltage detector, an output voltage controller that performs control to make a detected value of an output voltage of the power supply apparatus approach a target value in accordance with a comparison result between an output voltage of the converter and a reference voltage, and an instructed value reader that reads an instructed value regarding the output voltage from outside. A pre-bias voltage is applied across output terminals from an external circuit connected to the output terminals also during a time when the converter stops an operation. At a time when the converter starts to operate, the output voltage is set such that the output voltage becomes identical or approximately identical to a pre-bias voltage. After the output voltage has become identical or approximately identical to the pre-bias voltage, the output voltage is set such that the output voltage becomes an instructed voltage instructed from outside.

20 Claims, 7 Drawing Sheets

(51) Int. Cl.
  *H02M 1/36* (2007.01)
  *H02M 3/158* (2006.01)
  *G11C 5/14* (2006.01)
  *H02M 1/00* (2006.01)

(52) U.S. Cl.
  CPC ......... *H02M 3/158* (2013.01); *H02M 3/1582* (2013.01); *H02M 3/1588* (2013.01); *H02J 2007/0059* (2013.01); *H02M 2001/0025* (2013.01); *Y02B 70/1466* (2013.01)

(56) References Cited

U.S. PATENT DOCUMENTS

| | | |
|---|---|---|
| 2010/0231175 A1 | 9/2010 | Noda |
| 2011/0115450 A1 | 5/2011 | Pongratananukul |
| 2013/0015827 A1* | 1/2013 | Shi .................. H02J 7/0068 323/266 |
| 2013/0021017 A1 | 1/2013 | Okubo et al. |

FOREIGN PATENT DOCUMENTS

| | | |
|---|---|---|
| JP | 2002-142451 A | 5/2002 |
| JP | 2006-353032 A | 12/2006 |
| JP | 2007-053883 A | 3/2007 |
| JP | 2007-267582 A | 10/2007 |
| JP | 2013-27147 A | 2/2013 |
| JP | 2013-042595 A | 2/2013 |
| JP | 2013-138599 A | 7/2013 |
| JP | 2013-207993 A | 10/2013 |

OTHER PUBLICATIONS

Official Communication issued in corresponding Japanese Patent Application No. 2016-504144, dated Sep. 5, 2017.
Official Communication issued in European Patent Application No. 15 752 093.3, dated May 29, 2018.

* cited by examiner

FIG. 3

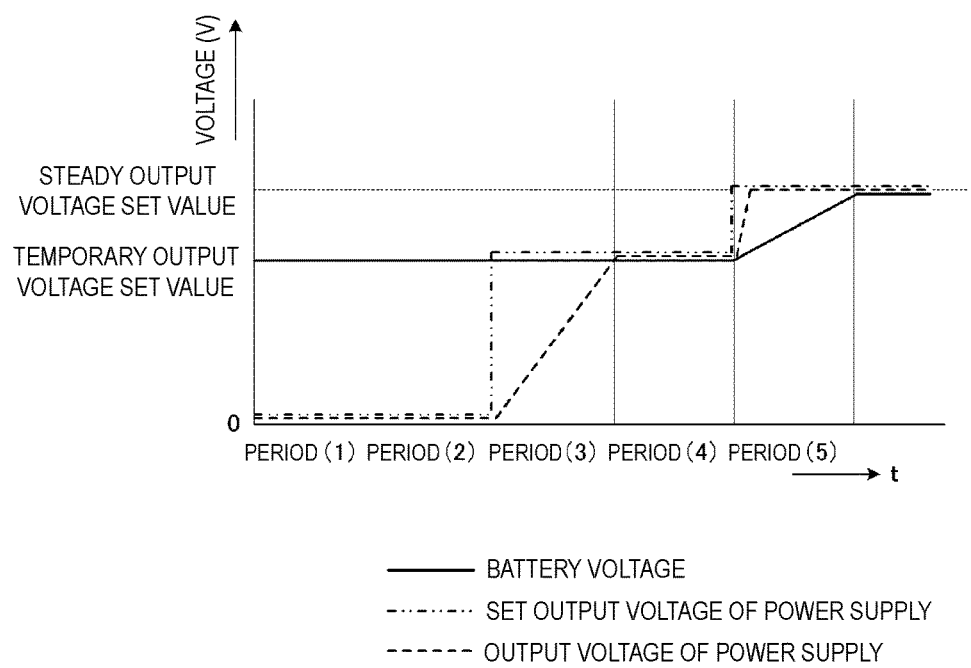

—— BATTERY VOLTAGE
—·——·— SET OUTPUT VOLTAGE OF POWER SUPPLY
— — — — OUTPUT VOLTAGE OF POWER SUPPLY

FIG. 4

|  | BATTERY VOLTAGE MONITORING | MICROCOMPUTER | POWER SUPPLY OUTPUT | STATE |
|---|---|---|---|---|
| PERIOD (1) | OFF | OFF | OFF | ALL-OFF STATE |
| PERIOD (2) | ON | ON | OFF | BATTERY VOLTAGE BEING MONITORED |
| PERIOD (3) | ON | ON | ON | SET TEMPORARY OUTPUT VOLTAGE IN ACCORDANCE WITH BATTERY VOLTAGE, AND POWER ON |
| PERIOD (4) | ON | ON | ON | MAKE OUTPUT VOLTAGE OF POWER SUPPLY FOLLOW BATTERY VOLTAGE |
| PERIOD (5) | ON | ON | ON | SET TO STEADY OUTPUT VOLTAGE AND CHARGE BATTERY |

|  | MICROCOMPUTER | POWER SUPPLY OUTPUT | STATE |
|---|---|---|---|
| PERIOD (1) | OFF | OFF | ALL-OFF STATE |
| PERIOD (2) | ON | ON | SET TEMPORARY OUTPUT VOLTAGE, AND POWER ON |
| PERIOD (3) | ON | ON | MAKE OUTPUT VOLTAGE OF POWER SUPPLY FOLLOW TEMPORARY OUTPUT VOLTAGE |
| PERIOD (4) | ON | ON | SET TO STEADY OUTPUT VOLTAGE AND CHARGE BATTERY |

POWER SUPPLY APPARATUS

CROSS REFERENCE TO RELATED APPLICATIONS

This application claims the benefit of priority to Japanese Patent Application 2014-031992 filed Feb. 21, 2014 and is a Continuation Application of PCT/JP2015/054532 filed on Feb. 19, 2015, the entire contents of each application are hereby incorporated herein by reference.

BACKGROUND OF THE INVENTION

1. Field of the Invention

The present invention relates to a power supply apparatus to which a pre-bias voltage is applied across output terminals from outside even when operation of a converter is stopped.

2. Description of the Related Art

A general switching power supply apparatus including a step-down converter circuit is disclosed in, for example, Japanese Unexamined Patent Application Publication No. 2013-207993. This switching power supply apparatus described in Japanese Unexamined Patent Application Publication No. 2013-207993 includes a control circuit that controls a high-side MOSFET and a low-side MOSFET so as to perform synchronous rectification, and is configured to increase power conversion efficiency through the control.

Japanese Unexamined Patent Application Publication No. 10-112942 discloses a power supply apparatus in which power supply apparatuses each including a converter and a secondary battery are connected in parallel and perform parallel operations. Each of the power supply apparatuses in Japanese Unexamined Patent Application Publication No. 10-112942 has a function of modifying the output voltage of the converter.

In a power supply system where a plurality of power supply apparatuses are connected in parallel for parallel operation, as described in Japanese Unexamined Patent Application Publication No. 10-112942, in a power supply apparatus in which a secondary battery, that is, a battery or a power supply circuit including a battery, is connected to the output terminal, a state is generated in which a voltage (hereinafter called a "pre-bias voltage") from outside, for example, from a battery is applied across the output terminals also during a period when the converter operation is stopped.

In the case where a power supply apparatus including a converter that controls switching devices through feedback control is made to operate by comparing a set voltage and an actual output voltage, as disclosed in Japanese Unexamined Patent Application Publication No. 2013-207993, when a difference between the set value and the present value of the output voltage is too large, the converter may not be activated normally in some cases. For example, a phenomenon is generated in which due to the fact that a difference between the set value and the present value of the output voltage is too large, a protection operation is activated, before the converter is activated, due to the operation of another circuit such as a protection circuit, thereby preventing normal activation.

Further, in the case where the output set voltage is lower than the voltage between output terminals due to a pre-bias voltage, or in the case where the output voltage of the power supply apparatus is transiently low at the time of activation or the like, a reverse current flows from the output terminals to the converter when a converter based on the synchronous rectifying method as disclosed in Japanese Unexamined Patent Application Publication No. 2013-207993 is employed.

Further, in the case where the set value (set voltage) of the output voltage of the power supply apparatus is high, an excessive charge current may flow from the power supply apparatus to a battery.

SUMMARY OF THE INVENTION

Preferred embodiments of the present invention provide power supply apparatuses that prevent an abnormal operation at a time of activation in a power supply apparatus where a state in which a pre-bias voltage is applied across output terminals is generated.

A power supply apparatus according to a preferred embodiment of the present invention includes a converter that performs power conversion, an output voltage detector that detects an output voltage, an output voltage controller that performs control to make the output voltage of the power supply apparatus approach a set voltage in accordance with a comparison result between a detected voltage of an output voltage of the converter and a reference voltage, and an instructed value reader that reads an instructed value regarding the output voltage from outside. A voltage is applied across output terminals from an external circuit connected to the output terminals also during a time when the converter stops an operation.

The power supply apparatus further includes a temporary output voltage setter that sets the output voltage at a time when the converter starts to operate such that the output voltage becomes identical or approximately identical to a target voltage that is set in advance and that is higher than the voltage applied from the external circuit and lower than the instructed value; and a steady output voltage setter that sets the output voltage such that, after the output voltage became identical or approximately identical to the target voltage, the output voltage becomes the voltage instructed from the outside.

A power supply apparatus according to a preferred embodiment of the present invention includes a converter that performs power conversion, an output voltage detector that detects an output voltage, an output voltage controller that performs control to make the output voltage of the power supply apparatus approach a set voltage in accordance with a comparison result between a detected voltage of an output voltage of the converter and a reference voltage, and an instructed value reader that reads an instructed value regarding the output voltage from outside. A voltage is applied across output terminals from an external circuit connected to the output terminals also during a time when the converter stops an operation.

The power supply apparatus further includes a temporary output voltage setter that detects, by using the output voltage detector, a voltage applied from the external circuit and sets, at a time when the converter starts to operate, the output voltage such that the output voltage becomes identical or approximately identical to the voltage applied from the external circuit; and a steady output voltage setter that sets the output voltage such that, after the output voltage became identical or approximately identical to the voltage applied from the external circuit, the output voltage becomes the voltage instructed from the outside.

With the preferred embodiments of the present invention described above, a difference between the instructed value and the present value is not too large, and an abnormal operation at activation is prevented.

Preferably, a power supply apparatus according to a preferred embodiment of the present invention includes a resistor voltage divider circuit dividing the voltage between the output terminals, where the temporary output voltage setter and the steady output voltage setter set the output voltage by changing a voltage superimposed on the resistor voltage divider circuit. According to this configuration, it becomes easy to set the output voltage.

Preferably, the temporary output voltage setter and the steady output voltage setter set the output voltage by controlling the reference voltage, when reference voltage setting is possible.

The instructed value reader, the temporary output voltage setter, and the steady output voltage setter may include or be defined by a microcontroller IC, and the output voltage controller may include or be defined by a PWM control IC, for example. According to this configuration, a general purpose PWM control IC is able to be used, and easy control at the time of activation is realized by the control of the microcontroller IC.

The instructed value reader, the temporary output voltage setter, the steady output voltage setter, and the output voltage controller may be formed of a single DSP. According to this configuration, the circuit is integrated, resulting in a reduction in size.

Preferably, the converter is a step-down converter including an inductor connected in series between an input power supply and an output power supply, a first switch conducting an excited current to the inductor during an ON time, and a second switch conducting a return current to the inductor during an ON time. According to this configuration, the circuit is able to be defined by a small number of components, and a converter operation with high efficiency is enabled. Further, a reverse current flows only in a short period when the set value of the output voltage is lower than a pre-bias voltage.

According to various preferred embodiments of the present invention, a difference between an instructed value and the present value does not become too large, and an abnormal operation such as an activation failure is prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3 is a diagram illustrating changes in voltages at the time when a power supply apparatus 101 is activated by the control of a microcontroller 11 and a PWM control IC 12.

FIG. 4 is a diagram illustrating the states of periods in FIG. 3.

DETAILED DESCRIPTION OF THE PREFERRED EMBODIMENTS

First Preferred Embodiment

Figure 1:
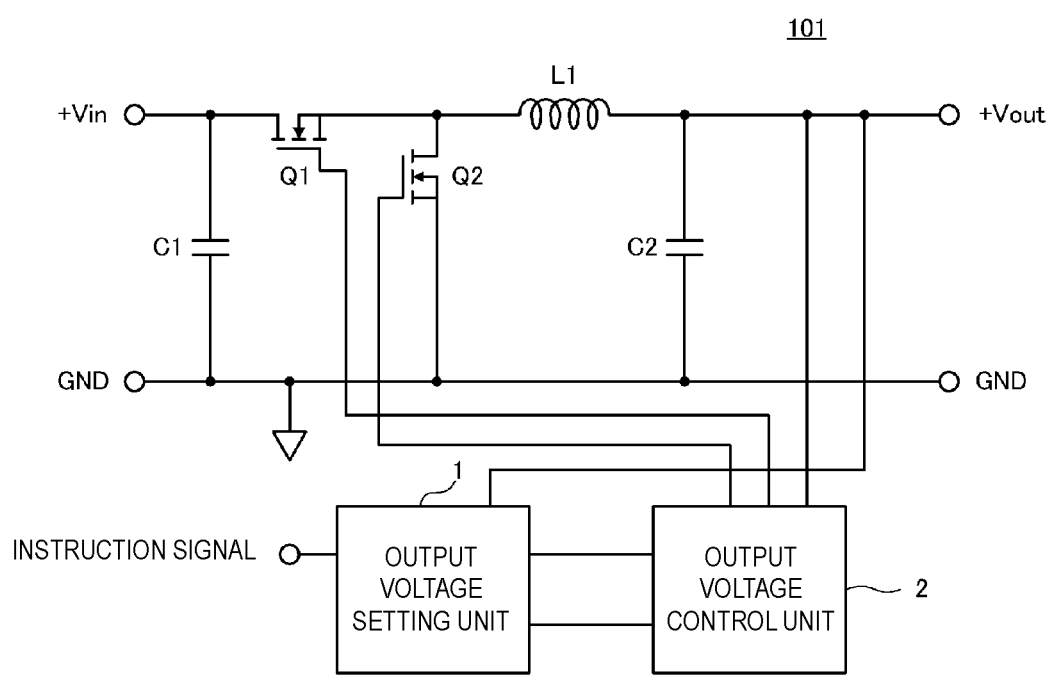
FIG. 1 is a circuit diagram in which a portion of a power supply apparatus according to a first preferred embodiment of the present invention is represented by a block diagram.
Figure 2:
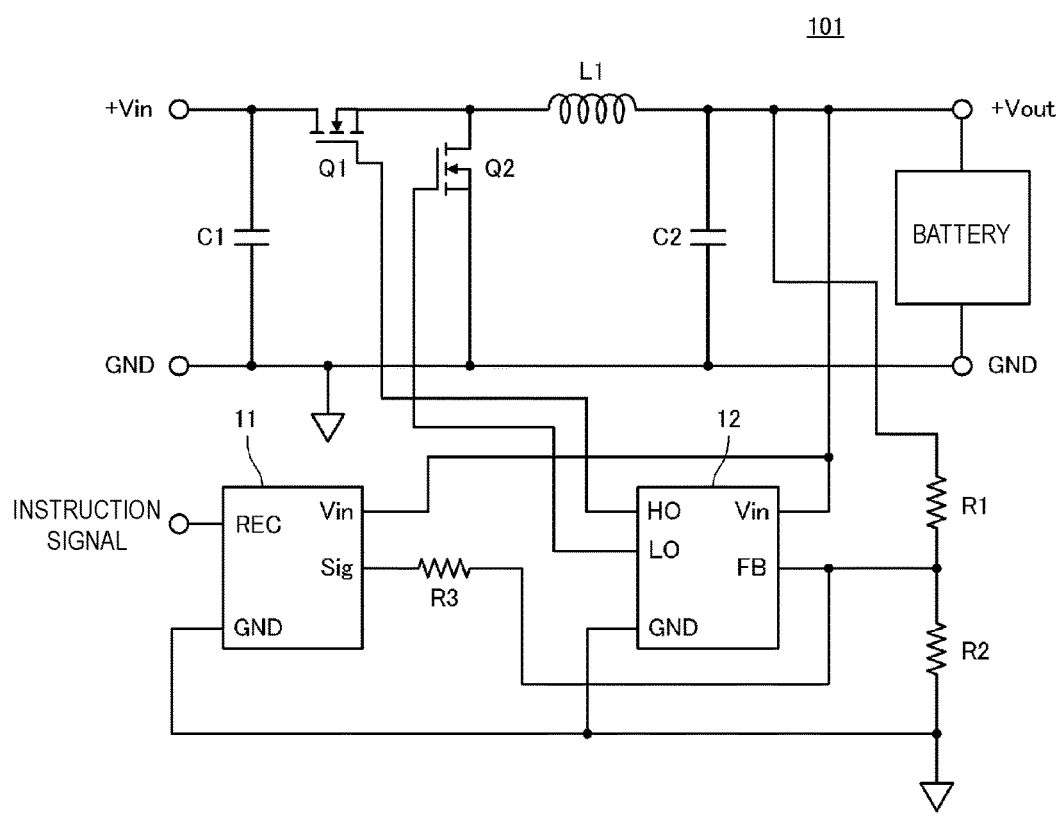
FIG. 2 is a circuit diagram of the power supply apparatus according to the first preferred embodiment of the present invention.

FIG. 1 is a circuit diagram in which a portion of a power supply apparatus according to a first preferred embodiment of the present invention is represented by a block diagram, and FIG. 2 is a circuit diagram of the power supply apparatus.

A power supply apparatus 101 of the present preferred embodiment is a power supply apparatus in which a terminal +Vin is an input power supply terminal and a terminal +Vout is an output power supply terminal, and includes an output voltage setter 1, an output voltage controller 2, and a converter. The converter includes an inductor L1 and a first switch Q1 connected in series with each other between the input power supply terminal and the output power supply terminal, the first switch Q1 that conducts an excitation current to the inductor L1 during its ON time, a second switch Q2 that conducts a return current to the inductor during its ON time, an input capacitor C1, and a smoothing capacitor C2. As a result of the first switch Q1 and the second switch Q2 being switched by the output voltage controller 2, the converter operates as a step-down converter. In other words, the first switch Q1 and the second switch Q2 are alternately switched on/off, the inductor L1 is excited during the ON period of the first switch Q1 and a return current flows through the inductor during the ON period of the second switch Q2. The step-down voltage is controlled by the on-duty ratio of the first switch Q1.

The output voltage setter 1, upon receipt of an instruction signal input from the outside, determines the set value of the output voltage for the output voltage controller 2.

FIG. 2 illustrates a specific example of the output voltage setter 1 and the output voltage controller 2. In FIG. 2, a battery is connected between the output terminal +Vout and a GND terminal. This battery is an example of an external circuit according to a preferred embodiment of the present invention. A microcontroller 11 operates with a voltage (battery voltage) of the output terminal +Vout of the power supply apparatus 101 as a power supply voltage. The microcontroller 11 reads the instructed value in the serial data input from an external host apparatus to a remote control terminal REC and outputs a control voltage for a PWM control IC 12 from a signal terminal Sig. The microcontroller 11 operates with an input voltage input to a power supply terminal Vin of the microcontroller 11 as a power supply, and also detects the input voltage. This functional unit or circuit portion of the microcontroller 11 that detects a voltage is an example of an "output voltage detector" according to a preferred embodiment of the present invention.

The PWM control IC 12 operates with the voltage (battery voltage) of the output terminal +Vout of the power supply apparatus 101 as a power supply voltage. The PWM control IC 12 generates a PWM modulation signal in accordance with the comparison result of an input voltage of a feedback terminal FB and an internally generated reference voltage, and outputs gate signals to the first switch Q1 and the second switch Q2 from output terminals HO and LO.

In FIG. 2, resistors R1 and R2 define a voltage divider circuit, which divides an output voltage output to the terminal +Vout and inputs the divided voltage to the feedback terminal FB. The signal terminal Sig of the microcontroller 11 is connected to the feedback terminal FB with a resistor R3 interposed therebetween.

The PWM control IC 12 controls the on-duty ratio of the PWM modulation signal such that the voltage of the feedback terminal FB becomes the same as the above-described reference voltage. This allows the voltage of the output terminal +Vout to be maintained at the set value.

A control signal supplied by the microcontroller 11 is superimposed on the voltage of the resistor voltage divider circuit including the resistors R1 and R2. The resultant voltage becomes the voltage of the feedback terminal FB. Hence, the microcontroller 11 performs the setting of the output voltage by using the output voltage output to the signal terminal Sig.

FIG. 3 is a diagram illustrating changes in the voltages at the time when the power supply apparatus 101 is activated by the control of the microcontroller 11 and the PWM control IC 12. FIG. 4 is a diagram illustrating the states of the periods in FIG. 3.

The operations in respective periods are as follows.

Period (1)

In period (1), a battery voltage (pre-bias voltage) which is a voltage applied by an external circuit is applied to the microcontroller 11 and the PWM control IC 12 as a power supply voltage, but an instructed value to the microcontroller 11 has not been received from the outside. The PWM control IC 12 is in a state in which the operation is stopped. Hence, the first switch Q1 and the second switch Q2 are both in an OFF state.

Period (2)

When the instructed value of the output voltage is input from the outside, the microcontroller 11 first detects the battery voltage (pre-bias voltage).

Period (3)

In accordance with the battery voltage detected in period (2), a temporary output voltage set value of the output voltage is determined and a corresponding control voltage is output to the PWM control IC 12. When the battery voltage detected in period (2) is, for example, 10 V, the temporary output voltage set value is determined to be 10 V. The PWM control IC 12 starts to operate and controls the on-duty ratio of a PWM modulation signal such that the output voltage of the output terminal +Vout becomes the temporary output voltage set value described above, thus performing feedback control. As a result, the output voltage gradually increases as illustrated in period (3) in FIG. 3. This operation of the microcontroller 11 is an example of the "temporary output voltage setter" according to a preferred embodiment of the present invention. This period (3) is, for example, several milliseconds. Period (3) is a period of state transition, which is short.

Period (4)

A state in which the output voltage of the power supply apparatus 101 has reached the battery voltage is maintained. This period (4) is, for example, about several milliseconds to fifty milliseconds.

Period (5)

A control voltage corresponding to the set value (steady output set value, for example, 12 V) of the proper output voltage based on the instructed value described above is output to the PWM control IC 12. As a result, the PWM control IC 12 performs feedback control by controlling the on-duty ratio of the PWM modulation signal such that the output voltage of the output terminal +Vout becomes the steady output set value described above. Hence, as illustrated by period (5) of FIG. 3, the output voltage becomes the steady output set value described above, and the battery charging voltage gradually increases. After that, the output voltage of the power supply apparatus 101 and the battery voltage are kept at a steady value of 12 V, for example. This operation of the microcontroller 11 is an example of the "steady output voltage setter" according to a preferred embodiment of the present invention.

Note that a period when the pre-bias voltage is zero is also the same as period (1) described above, since the microcontroller 11 and the PWM control IC 12 do not operate.

Further, a configuration may be used in which, even when the instructed value of the output voltage is not input from the outside, a pre-bias voltage is applied, and when the microcontroller 11 has started activation, the battery voltage (pre-bias voltage) is first detected. This period corresponds to period (2) described above.

As described above, a state in which the difference between the instructed value of the output voltage and the present value is too large is not entered, and a state in which the instructed value of the output voltage is much lower than the pre-bias voltage is not generated either. Hence, an abnormal operation such as an activation failure is prevented.

According to the present preferred embodiment, a PWM control IC that does not have a reference voltage terminal as illustrated in a second preferred embodiment of the present invention described below may be used.

Note that in the example illustrated in FIG. 3, a temporary output voltage setter preferably sets a voltage equal to the pre-bias voltage as a temporary output voltage. However, the temporary output voltage need not be exactly the same as the pre-bias voltage. If the difference between the temporary output voltage and the actual pre-bias voltage is small to a certain extent and the converter is able to be activated normally, the voltages may be the same or approximately the same.

Note that the output of the signal terminal Sig may be a PWM modulation signal, not limited to an analog signal. In this case, a smoothing circuit connected to the signal terminal Sig need only be externally provided.

Second Preferred Embodiment

Figure 5:
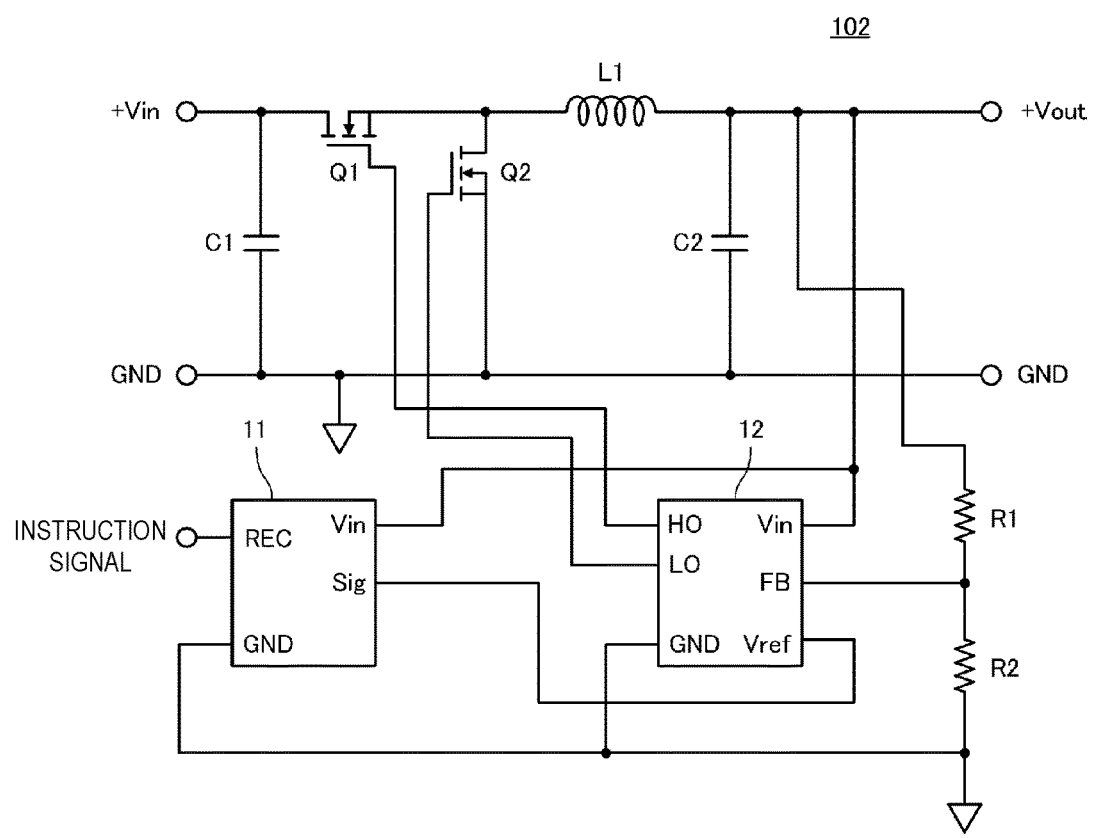
FIG. 5 is a circuit diagram of a power supply apparatus 102 according to a second preferred embodiment of the present invention.

FIG. 5 is a circuit diagram of a power supply apparatus 102 according to a second preferred embodiment of the present invention. The power supply apparatus 102 is different from the power supply apparatus 101 illustrated in FIG. 1 in the first preferred embodiment in terms of the connection relationship between the microcontroller 11 and the PWM control IC 12. In FIG. 5, the PWM control IC 12 includes a reference voltage terminal Vref that receives a reference voltage from the outside. The signal terminal Sig of the microcontroller 11 is connected to the reference voltage terminal Vref of the PWM control IC 12. With this configuration, the microcontroller 11 provides a reference voltage to the reference voltage terminal Vref of the PWM control IC 12.

The PWM control IC 12 controls the on-duty ratio of a PWM modulation signal such that the voltage of the feedback terminal FB becomes the same as the voltage (reference voltage) of the reference voltage terminal. The microcontroller 11, by controlling the reference voltage of the PWM control IC 12, controls the output voltage. In other words, setting of the temporary output voltage set value and the steady output set value of the output voltage described in the first preferred embodiment are determined by the reference voltage of the PWM control IC 12. For example, in the case where control equivalent to the example illustrated in FIG. 3 is performed, the reference voltage of the PWM control IC 12 is set such that the output voltage becomes 10 V as a set voltage during period (3). Also, the reference voltage of the PWM control IC 12 is set such that the output voltage becomes 12 V as a set voltage during period (5). The set voltage is set in each period.

According to the present preferred embodiment, in the case where a PWM control IC including a reference voltage terminal is used, the configuration of connection between the microcontroller 11 and the PWM control IC 12 is simplified.

Third Preferred Embodiment

Figure 6:
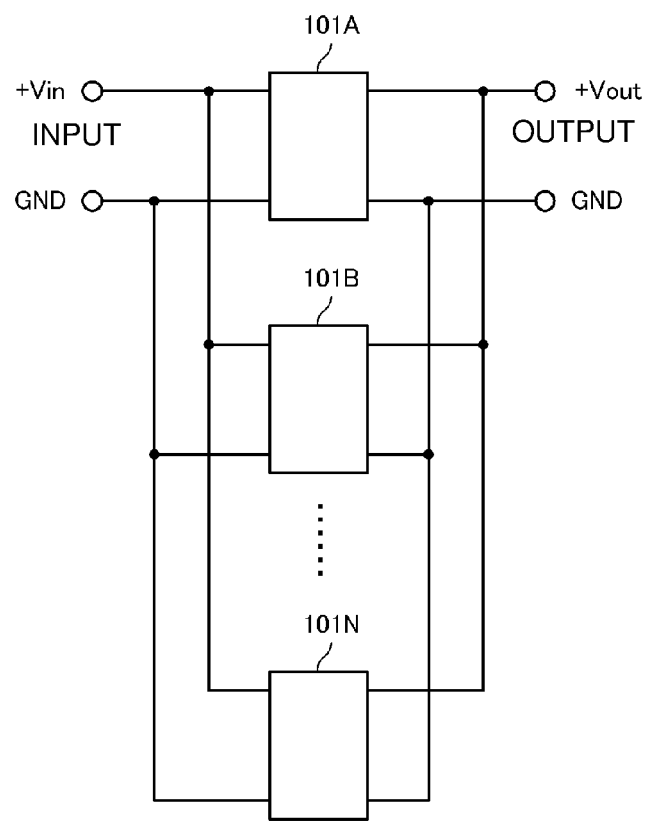
FIG. 6 is a block diagram of a power supply system according to a third preferred embodiment of the present invention.

FIG. 6 is a block diagram of a power supply system according to a third preferred embodiment of the present invention. The present preferred embodiment is an example of a power supply system in which the input interfaces and the output interfaces of a plurality of power supply apparatuses 101A, 101B, ..., and 101N are respectively connected in parallel with one another, and are operated in parallel. The configuration of each of the power supply apparatuses 101A, 101B, ..., and 101N is the same as that of the power supply apparatus described in the first or second preferred embodiment.

In the first and second preferred embodiments, examples have been described in which a battery is connected between the output terminals of the power supply apparatus. Also in the system in which the output interfaces of a plurality of power supply apparatuses are connected in parallel with one another as in the present preferred embodiment, when the converter of one of the power supply apparatuses is operating, a pre-bias voltage is applied across the output terminals of each of other power supply apparatuses. According to a preferred embodiment of the present invention, also in the power supply system performing parallel operations like this, an abnormal operation such as an activation failure is able to be prevented by functions described in the first and second preferred embodiments.

Fourth Preferred Embodiment

The circuit configuration of a power supply apparatus according to a fourth preferred embodiment of the present invention preferably is the same as those illustrated in FIG. 1 and FIG. 2 in the first preferred embodiment, except for the details of the control of the output voltage setter 1.

Figures 7, 8:
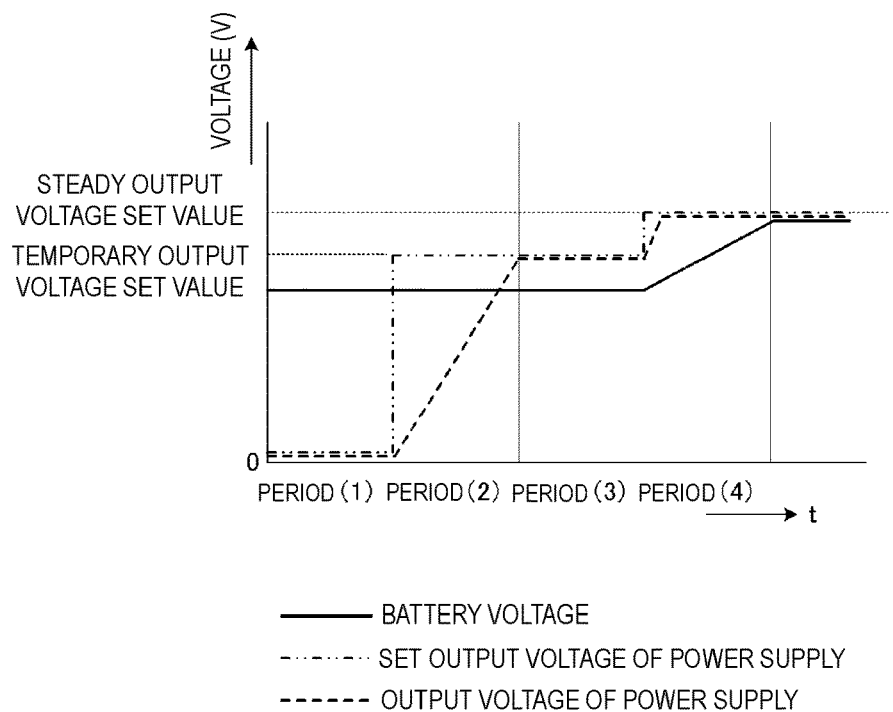
FIG. 7 is a diagram illustrating changes in voltages at activation of a power supply apparatus of a fourth preferred embodiment of the present invention.
FIG. 8 is a diagram illustrating the states of the periods in FIG. 7.

FIG. 7 is a diagram illustrating changes in voltages at activation of the power supply apparatus of the present preferred embodiment. FIG. 8 is a diagram illustrating the states of the periods in FIG. 7. The operations during the periods are as follows.

Period (1)

A battery voltage (pre-bias voltage) is applied as a power supply voltage, but an instructed value has not been received from the outside. This period (1) is the same as period (1) illustrated in FIG. 3 of the first preferred embodiment.

Period (2)

A temporary output voltage set value is determined as a target voltage which is higher than a battery voltage (pre-bias voltage) and lower than the instructed value described above. Since the range of the battery voltage is known in advance, and is not based on the present battery voltage, the temporary output voltage set value is able to be determined in advance. This temporary output voltage set value may be a voltage higher than the battery voltage (pre-bias voltage) to an extent that an activation failure is not caused. As a result, the output voltage gradually increases, as illustrated in period (2) of FIG. 7.

Period (3)

A state is maintained in which the output voltage of the power supply apparatus has reached the voltage of the temporary output voltage set value. This period (3) corresponds to period (4) illustrated in FIG. 3 in the first preferred embodiment.

Period (4)

Control is performed such that the output voltage of the power supply apparatus becomes a voltage corresponding to the proper output voltage set value (steady output set value) based on the instructed value described above. As a result, as illustrated in period (4) of FIG. 7, the output voltage becomes the steady output set value and the battery charging voltage gradually increases. After that, the output voltage of the power supply apparatus and the battery voltage are kept at a steady value. This period (4) corresponds to period (5) illustrated in FIG. 3 in the first preferred embodiment.

As a result of the control described above, a state in which the difference between the instructed value of the output voltage and the present value is too large is not entered, and a state in which the instructed value of the output voltage is lower than the pre-bias voltage is not generated either. Hence, an abnormal operation such as an activation failure is prevented.

According to the present preferred embodiment, the temporary output voltage set value preferably is a predetermined value and the battery voltage (pre-bias voltage) need not be detected before activation. Hence, operation steps at the activation time are simplified. In other words, period (2) of FIG. 3 described in the first preferred embodiment is not needed.

Fifth Preferred Embodiment

Figure 9:
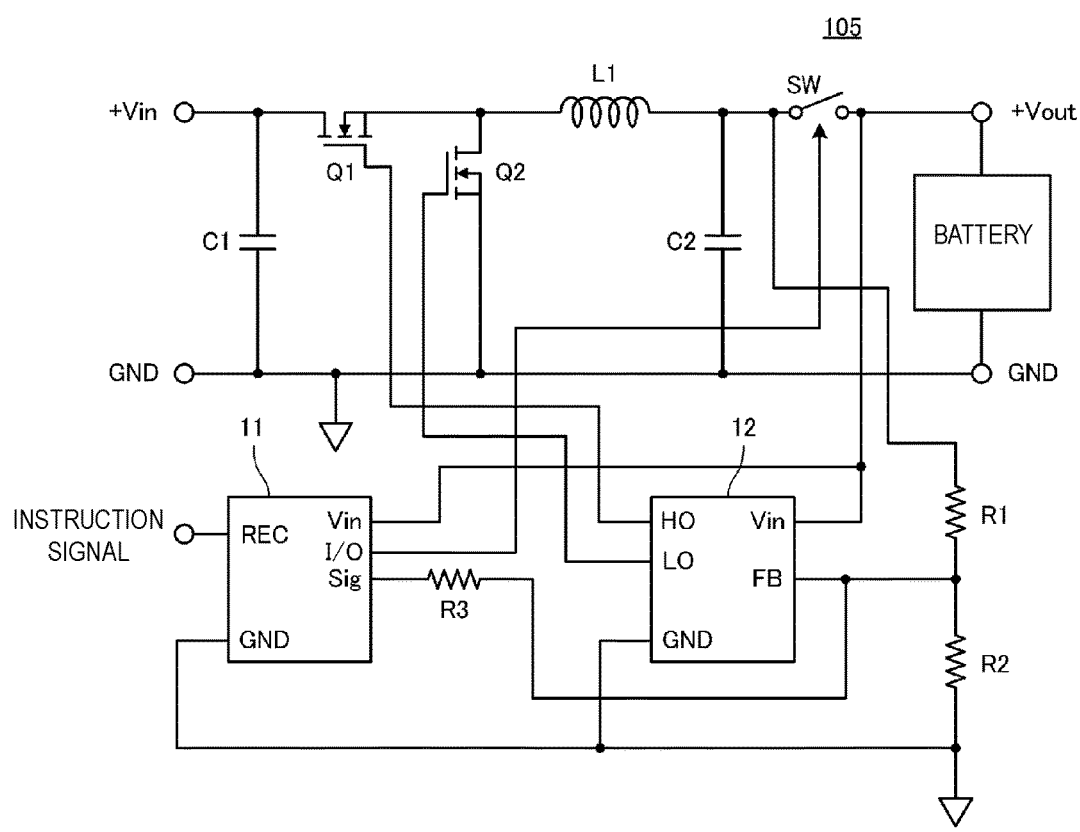
FIG. 9 is a circuit diagram of the main portions of a power supply apparatus 105 according to a fifth preferred embodiment of the present invention.

FIG. 9 is a circuit diagram of the main portions of a power supply apparatus according to a fifth preferred embodiment of the present invention. Unlike the power supply apparatus illustrated in FIG. 2 in the first preferred embodiment, a switch SW is provided on the line of the output power supply terminal +Vout. Further, control performed by the microcontroller 11 is different from that in the first preferred embodiment.

The microcontroller 11 of a power supply apparatus 105 performs control illustrated in FIG. 3 or FIG. 7. However, the switch SW is switched on during periods (4) and (5) in FIG. 3 or periods (3) and (4) in FIG. 7.

As a result of this, a rush current flowing from the converter into the battery at the operation initiation time of the converter is able to be effectively reduced or prevented. Hence, the converter is able to be activated while significantly reducing or preventing a transient current. Further, by turning on the switch SW during period (4) in FIG. 3 or period (3) in FIG. 7, influx of current to the converter from the battery during the ON period of the switch SW is able to be significantly reduced or prevented.

Other Preferred Embodiments

In the first, second, and fifth preferred embodiments, examples have been described in which the output voltage setter 1 illustrated in FIG. 1 preferably is defined by the microcontroller and the main portion of the output voltage controller 2 is preferably defined by the PWM control IC 12. However, a combination of the output voltage setter 1 and the output voltage controller 2 illustrated in FIG. 1 may be defined by a single digital signal processor (DSP), for example. This allows the circuits to be integrated and realizes a reduction in size.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A power supply apparatus comprising:
    a converter that performs power conversion;
    an output voltage detector that detects an output voltage of the converter;
    an output voltage controller that performs control to make an output voltage of the power supply apparatus approach a set voltage in accordance with a comparison result between a detected voltage of the output voltage of the converter and a reference voltage, and a voltage is applied across output terminals from an external circuit connected to the output terminals during a time when the converter stops an operation;
    an instructed value reader that reads an instructed value regarding the output voltage from outside;
    a temporary output voltage setter that sets the output voltage at a time when the converter starts to operate such that the output voltage becomes identical or approximately identical to a target voltage that is set in advance and that is higher than the voltage applied from the external circuit and lower than the instructed value; and
    a steady output voltage setter that sets the output voltage such that, after the output voltage has become identical or approximately identical to the target voltage, the output voltage becomes the voltage instructed from the outside.

2. The power supply apparatus according to claim 1, further comprising:
    a voltage divider circuit dividing the voltage between the output terminals; wherein
    the temporary output voltage setter and the steady output voltage setter set the output voltage by changing a voltage superimposed on the voltage divider circuit.

3. The power supply apparatus according to claim 1, wherein the temporary output voltage setter and the steady output voltage setter set the output voltage by controlling the reference voltage.

4. The power supply apparatus according to claim 1, wherein
    the instructed value reader, the temporary output voltage setter, and the steady output voltage setter are defined by a microcontroller IC; and
    the output voltage controller is defined by a PWM control IC.

5. The power supply apparatus according to claim 1, wherein the instructed value reader, the temporary output voltage setter, the steady output voltage setter, and the output voltage controller are defined by a single digital signal processor.

6. The power supply apparatus according to claim 1, wherein the converter is a step-down converter including an inductor connected in series between an input power supply and an output power supply, a first switch conducting an excited current to the inductor during an ON time, and a second switch conducting a return current to the inductor during an ON time.

7. The power supply apparatus according to claim 1, wherein the voltage divider circuit includes a plurality of resistors.

8. The power supply apparatus according to claim 4, wherein the PWM control IC includes a reference voltage terminal that receives a reference voltage from the outside.

9. The power supply apparatus according to claim 1, wherein a battery is connected between the output terminals.

10. The power supply apparatus according to claim 1, wherein a switch is provided on a line of one of the output terminals.

11. A power supply apparatus comprising:
    a converter that performs power conversion,
    an output voltage detector that detects an output voltage of the converter;
    an output voltage controller that performs control to make an output voltage of the power supply apparatus approach a set voltage in accordance with a comparison result between a detected voltage of the output voltage of the converter and a reference voltage, and a voltage is applied across output terminals from an external circuit connected to the output terminals also during a time when the converter stops an operation;
    an instructed value reader that reads an instructed value regarding the output voltage from outside;
    a temporary output voltage setter that detects, by using the output voltage detector, a voltage applied from the external circuit and sets, at a time when the converter starts to operate, the output voltage such that the output voltage becomes identical or approximately identical to the voltage applied from the external circuit; and
    a steady output voltage setter that sets the output voltage such that, after the output voltage has become identical or approximately identical to the voltage applied from the external circuit, the output voltage becomes the voltage instructed from the outside.

12. The power supply apparatus according to claim 11, further comprising:
    a voltage divider circuit dividing the voltage between the output terminals; wherein
    the temporary output voltage setter and the steady output voltage setter set the output voltage by changing a voltage superimposed on the voltage divider circuit.

13. The power supply apparatus according to claim 11, wherein the temporary output voltage setter and the steady output voltage setter set the output voltage by controlling the reference voltage.

14. The power supply apparatus according to claim 11, wherein
    the instructed value reader, the temporary output voltage setter, and the steady output voltage setter are defined by a microcontroller IC; and
    the output voltage controller is defined by a PWM control IC.

15. The power supply apparatus according to claim 11, wherein the instructed value reader, the temporary output voltage setter, the steady output voltage setter, and the output voltage controller are defined by a single digital signal processor.

16. The power supply apparatus according to claim 11, wherein the converter is a step-down converter including an inductor connected in series between an input power supply and an output power supply, a first switch conducting an excited current to the inductor during an ON time, and a second switch conducting a return current to the inductor during an ON time.

17. The power supply apparatus according to claim 11, wherein the voltage divider circuit includes a plurality of resistors.

18. The power supply apparatus according to claim 14, wherein the PWM control IC includes a reference voltage terminal that receives a reference voltage from the outside.

19. The power supply apparatus according to claim 11, wherein a battery is connected between the output terminals.

20. The power supply apparatus according to claim 1, wherein a switch is provided on a line of one of the output terminals.

\* \* \* \* \*